US009935160B2

(12) United States Patent
Lv et al.

(10) Patent No.: US 9,935,160 B2
(45) Date of Patent: Apr. 3, 2018

(54) OLED DISPLAY DEVICE HAVING PIXEL SEPARATION LAYER SIDEWALL COMPRISING CURVED SECTIONS

(71) Applicant: Shenzhen China Star Optoelectronics Technology Co., Ltd., Shenzhen (CN)

(72) Inventors: Xiaowen Lv, Shenzhen (CN); Hejing Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 211 days.

(21) Appl. No.: 14/762,805

(22) PCT Filed: May 25, 2015

(86) PCT No.: PCT/CN2015/079663
§ 371 (c)(1),
(2) Date: Jul. 22, 2015

(87) PCT Pub. No.: WO2016/165196
PCT Pub. Date: Oct. 20, 2016

(65) Prior Publication Data
US 2017/0141165 A1    May 18, 2017

(30) Foreign Application Priority Data
Apr. 13, 2015    (CN) .......................... 2015 1 0173282

(51) Int. Cl.
*H01L 27/32*    (2006.01)
*H01L 51/52*    (2006.01)
*H01L 51/50*    (2006.01)

(52) U.S. Cl.
CPC ...... *H01L 27/3246* (2013.01); *H01L 51/5012* (2013.01); *H01L 51/5206* (2013.01);
(Continued)

(58) Field of Classification Search
CPC . H01L 27/326; H01L 27/14812; H01L 51/52; H01L 27/3283; H01L 27/3295; H01L 27/3246
See application file for complete search history.

(56) References Cited

U.S. PATENT DOCUMENTS

2008/0042290 A1*    2/2008  Lee .................. H01L 21/76804
                                                              257/760
2014/0097409 A1*    4/2014  Choi ..................... H01L 51/52
                                                              257/40
(Continued)

FOREIGN PATENT DOCUMENTS

CN           104241329 A      12/2014
CN           104282713 A       1/2015
TW           201031258 A       8/2010

*Primary Examiner* — Daniel Whalen
*Assistant Examiner* — Suberr Chi
(74) *Attorney, Agent, or Firm* — Leong C. Lei

(57) ABSTRACT

The present invention provides an OLED display device, which includes: a substrate (1), a plurality of pixel zones arranged in an array on the substrate (1), each of the pixel zones comprising a pixel electrode (2), an organic light-emitting layer (3), and a common electrode (4) that are sequentially stacked on the substrate (1), and a pixel separation layer (5) including a plurality of openings, the openings being each delimited and circumferentially surrounded by a pixel separation layer sidewall (51), each of the openings corresponding to one of the pixel zones. The pixel separation layer (5) is formed of an inorganic material. The pixel separation layer sidewall (51) includes, arranged from top to bottom, a first curved section (511), a linear section (512), and a second curved section (513), so as to overcome a deterioration issue of the organic light-emitting layer (3) caused by the pixel separation layer sidewall (51), prevent the organic light-emitting layer (3) and the common electrode (4) from breaking at a site corresponding to the pixel (Continued)

separation layer sidewall (51), prevent shorting between the common electrode (4) and the pixel electrode (2), which are the cathode and anode of the OLED display device, and improve displaying performance.

14 Claims, 3 Drawing Sheets

(52) U.S. Cl.
CPC .... *H01L 51/5221* (2013.01); *H01L 2251/301* (2013.01); *H01L 2251/5392* (2013.01)

(56) References Cited

U.S. PATENT DOCUMENTS

| | | | |
|---|---|---|---|
| 2015/0060832 A1* | 3/2015 | Ito ..................... | H01L 51/5225 257/40 |
| 2015/0155219 A1* | 6/2015 | Shin .................... | H01L 23/367 349/43 |

* cited by examiner

OLED DISPLAY DEVICE HAVING PIXEL SEPARATION LAYER SIDEWALL COMPRISING CURVED SECTIONS

BACKGROUND OF THE INVENTION

1. Field of the Invention

The present invention relates to the field of displaying technology, and in particular to an OLED display device.

2. The Related Arts

An OLED (Organic Light-Emitting Display) device shows excellent displaying performance and also possesses various advantages, such as being self-luminous, simple structure, being ultra-thin, fast response, wide view angle, low power consumption, and being capable of achieving flexible displaying and is thus regarded as a "dream display", so that it has attracted the attention of major display manufacturers and becomes the mainstream of the third-generation display devices in the field of displaying technology.

The OLED display device is a spontaneous emission display device and is generally made up of a pixel electrode and a common electrode respectively functioning as an anode and a cathode and an organic light emission layer arranged between the pixel electrode and the common electrode. When a proper voltage is applied to the anode and the cathode, the organic light emission layer emits light. The organic light emission layer comprises a hole injection layer formed on the anode, a hole transport layer formed on the hole injection layer, an emissive layer formed on the hole transport layer, an electron transport layer formed on the emissive layer, and an electron injection layer formed on the electron transport layer. Light emitting mechanism is that when driven by a predetermined voltage, electrons and holes are respectively injected into the electron injection layer and the hole injection layer. The electrons and the holes migrate through the electron transport layer and the hole transport layer to the emissive layer and combine with each other in the emissive layer to form excitons that excite light-emitting molecules, the later undergoing radiation relaxation to give off visible light.

Generally speaking, an OLED display device comprises a plurality of pixel zones arranged in a matrix, a pixel separation layer having multiple opening for separating each pixel zones from the remaining pixel zones. Each opening corresponds to one pixel zone. The pixel electrode and the organic light-emitting layer are arranged in the opening and the common electrode is set on the organic light-emitting layer and the pixel separation layer of each pixel zone.

Since the organic light-emitting layer is formed of an organic material and is very sensitive to moisture and oxygen, it may get deteriorated and changed due to invasion of moisture and oxygen. Heretofore, the pixel separation layer is made of an organic material and it has been recognized that when the organic material that makes the pixel separation layer presents an interface contacting the organic light-emitting layer, moisture and oxygen contained in the pixel separation layer may spread through the interface into the organic light-emitting layer, causing a change of the electron state in the organic light-emitting layer and thus resulting in loss of the ideal electric-field induced light emission characteristics and deteriorating the organic light-emitting layer to affect displaying performance. To improve the problem caused by the organic material of the pixel separation layer, a pixel separation layer made of an inorganic material that has less content of moisture and oxygen has been proposed. However, for a pixel separation layer made of an inorganic material, sidewalls that define the opening of the pixel separation layer are generally vertically erected, at approximately 90 degrees, with respect to a substrate, making the portion of the organic light-emitting layer and the common electrode that corresponds to the sidewalls significantly thinner than other portions or even broken, whereby moisture and oxygen may enter the organic light-emitting layer through the thinned or broken portion of the common electrode, leading to deterioration of the light emission characteristics of the organic light-emitting layer. Further, if the organic light-emitting layer is broken at a site of the sidewalls, the distance between the common electrode and the pixel electrode may get extremely close, leading to shorting between the two electrode and thus damaging the organic light-emitting layer.

SUMMARY OF THE INVENTION

An object of the present invention is to provide an OLDE (Organic Light-Emitting Display) display substrate, which overcomes deterioration of light emission characteristics of an organic light-emitting layer caused by a spacing wall, prevents shorting between an anode and a cathode, and improves displaying performance.

An object of the present invention is to provide an OLDE (Organic Light-Emitting Display) display device, which overcomes deterioration issues of an organic light-emitting layer caused by a sidewall of a pixel separation layer and prevents breaking of the organic light-emitting layer and the common electrode from occurring at a site corresponding to the sidewall of the pixel separation layer, prevents shorting between a common electrode and a pixel electrode, which are respectively a cathode and an anode of the OLED display device, and thus improving displaying performance.

To achieve the object, the present invention provides an OLED display device, which comprises:

a substrate;

a plurality of pixel zones arranged in an array on the substrate, each of the pixel zones comprising a pixel electrode, an organic light-emitting layer, and a common electrode that are sequentially stacked on the substrate; and a pixel separation layer that comprises a plurality of openings, the pixel separation layer separating each of the pixel zones from the other pixel zones, the openings being each delimited and circumferentially surrounded by a pixel separation layer sidewall, each of the openings corresponding to one of the pixel zones;

wherein the pixel electrode and the organic light-emitting layer are disposed in each of the openings in such a way that the organic light-emitting layer covers the pixel separation layer sidewall, the common electrode covering the organic light-emitting layer and an upper surface of the pixel separation layer; and the pixel separation layer is formed of an inorganic material and the pixel separation layer sidewall comprises, arranged from top to bottom, a first curved section, a linear section connected to the first curved section, and a second curved section connected to the linear section, the linear section being parallel to the substrate, at least one of a tangential plane of a portion of the first curved section or a tangential plane of a portion the second curved section forming an included angle of less than 85° with respect to the substrate.

The first curved section and the second curved section are both inward concave with respect to the pixel separation layer.

The first curved section and the second curved section are both outward convex with respect to the pixel separation layer.

The pixel separation layer is formed of silicon nitride.

The pixel separation layer comprises a plurality of silicon nitride layers having different component ratios of nitrogen and stacked on each other.

The pixel separation layer is formed through plasma chemical vapor deposition (CVD) and the openings of the pixel separation layer are formed through an etching process.

The pixel electrode serves as an anode of the OLED display device and the common electrode serves as a cathode of the OLED display device.

The pixel electrode comprises a material of metal oxide that has high work function and the common electrode comprises a material of metal that has high electrical conductivity and low work function.

The pixel electrode serves as a cathode of the OLED display device and the common electrode serves as an anode of the OLED display device.

The pixel electrode comprises a material of metal that has high electrical conductivity and low work function and the common electrode comprises a material of metal oxide that has high work function.

The present invention also provides an OLED display device, which comprises:

a substrate;

a plurality of pixel zones arranged in an array on the substrate, each of the pixel zones comprising a pixel electrode, an organic light-emitting layer, and a common electrode that are sequentially stacked on the substrate; and a pixel separation layer that comprises a plurality of openings, the pixel separation layer separating each of the pixel zones from the other pixel zones, the openings being each delimited and circumferentially surrounded by a pixel separation layer sidewall, each of the openings corresponding to one of the pixel zones;

wherein the pixel electrode and the organic light-emitting layer are disposed in each of the openings in such a way that the organic light-emitting layer covers the pixel separation layer sidewall, the common electrode covering the organic light-emitting layer and an upper surface of the pixel separation layer; and the pixel separation layer is formed of an inorganic material and the pixel separation layer sidewall comprises, arranged from top to bottom, a first curved section, a linear section connected to the first curved section, and a second curved section connected to the linear section, the linear section being parallel to the substrate, at least one of a tangential plane of a portion of the first curved section or a tangential plane of a portion the second curved section forming an included angle of less than 85° with respect to the substrate;

wherein the first curved section and the second curved section are both inward concave with respect to the pixel separation layer;

wherein the pixel separation layer is formed of silicon nitride; and wherein the pixel separation layer comprises a plurality of silicon nitride layers having different component ratios of nitrogen and stacked on each other.

The efficacy of the present invention is that the present invention provides an OLED display device, in which, on the one hand, an inorganic material is used to form a pixel separation layer in order to greatly reduce the amount of moisture and oxygen spread from a pixel separation layer sidewall to an organic light-emitting layer and, on the other hand, the pixel separation layer sidewall is constructed to comprise a first curved section, a linear section, and a second curved section arranged from top to bottom, wherein the linear section is parallel to a substrate; at least one of a tangential plane of a portion of the first curved section or a tangential plane of a portion the second curved section forms an included angle of less than 85° with respect to the substrate so that an organic light-emitting layer set on and covering the pixel separation layer sidewall and a common electrode set on and covering the organic light-emitting layer may have uniform thicknesses, preventing the organic light-emitting layer and the common electrode from breaking at a site corresponding to the pixel separation layer sidewall and preventing moisture and oxygen from penetrating into the organic light-emitting layer so as to overcome a deterioration issue of the organic light-emitting layer caused by the pixel separation layer sidewall, prevent shorting between the common electrode and the pixel electrode, which are respectively the cathode and anode of the OLED display device, and thus improving displaying performance and enhancing the lifespan of the OLED display device.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the effectiveness thereof, a detailed description will be given to a preferred embodiment of the present invention and the attached drawings.

Figure 1:
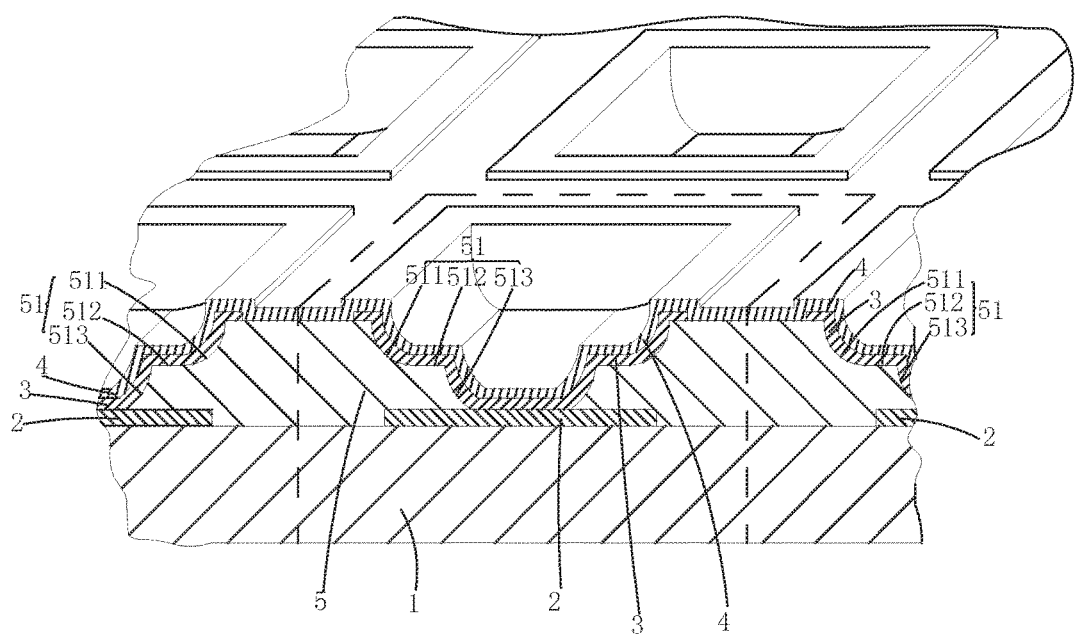
FIG. 1 is a cross-sectional view showing a pixel zone of an OLED display device according to the present invention.

Referring to FIG. 1, the present invention provides an organic light-emitting display (OLED) device, which comprises:

a substrate 1;

a plurality of pixel zones arranged in an array on the substrate 1, each of the pixel zones comprising a pixel electrode 2, an organic light-emitting layer 3, and a common electrode 4 that are sequentially stacked on the substrate 1; and a pixel separation layer 5 that comprises a plurality of openings, the pixel separation layer 5 separating each of the pixel zones from the other pixel zones, the openings being each delimited and circumferentially surrounded by a pixel separation layer sidewall 51, each of the openings corresponding to one of the pixel zones.

The pixel electrode 2 and the organic light-emitting layer 3 are disposed in each of the openings in such a way that the organic light-emitting layer 3 covers the pixel separation layer sidewall 51. The common electrode 4 covers the organic light-emitting layer 3 and an upper surface of the pixel separation layer 5.

The pixel separation layer 5 is formed of a material that is an inorganic material. The pixel separation layer sidewall 51 comprises, arranged from top to bottom, a first curved section 511, a linear section 512 connected to the first curved section 511, and a second curved section 513 connected to the linear section 512. The linear section 511 is parallel to the substrate 1. At least one of a tangential plane of a portion of the first curved section 511 or a tangential plane of a portion the second curved section 513 forms an included angle of less than 85° with respect to the substrate 1.

It is noted that under the condition that at least one of a tangential plane of a portion of the first curved section 511 or a tangential plane of a portion the second curved section 513 forms an included angle of less than 85° with respect to the substrate 1, the first curved section 511 and the second curved section 513 do not have to be structured such that all portions of both of them form an included angle less than 85° with respect to the substrate 1.

Figure 2:
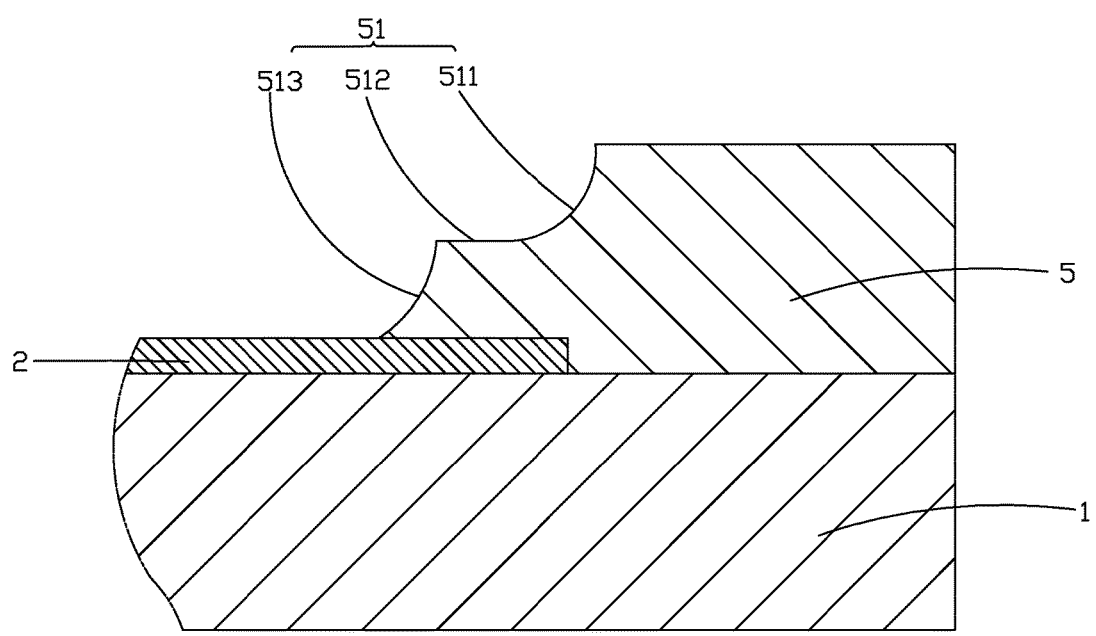
FIG. 2 is a cross-sectional view illustrating a shape of a sidewall of a pixel separation illustrated in FIG. 1 according to a first embodiment of the present invention.

FIG. 2 illustrates a first embodiment of the shape of the pixel separation layer sidewall 51. The first curved section 511 is concave inward with respect to the pixel separation layer 5 and the second curved section 513 is also concave inward with respect to the pixel separation layer 5. A tangential plane of a portion of the first curved section 511 forms an included angle less than 85° with respect to the substrate 1, and a tangential plane of a portion of the second curved section 513 also forms an included angle that is less than 85° with respect to the substrate 1. The first curved section 511 and the linear section 512 are connected to each other in a manner of being tangential to each other at the connection and the second curved section 513 and the linear section 512 are connected to each other through simple joining.

Figure 3:
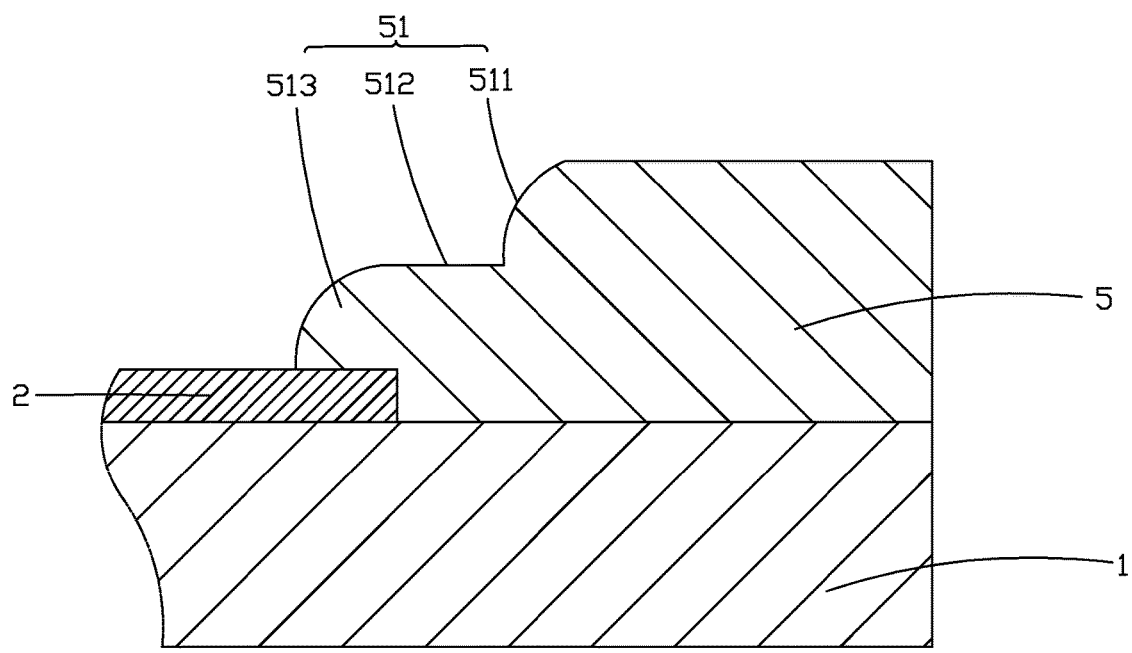
FIG. 3 is a cross-sectional view illustrating a shape of a sidewall of a pixel separation illustrated in FIG. 1 according to a second embodiment of the present invention.

FIG. 3 illustrates a second embodiment of the shape of the pixel separation layer sidewall 51. The first curved section 511 is convex outward with respect to the pixel separation layer 5 and the second curved section 513 is also convex outward with respect to the pixel separation layer 5. A tangential plane of a portion of the first curved section 511 forms an included angle less than 85° with respect to the substrate 1, and a tangential plane of a portion of the second curved section 513 also forms an included angle that is less than 85° with respect to the substrate 1. The first curved section 511 and the linear section 512 are connected through simple joining and the second curved section 513 and the linear section 512 are connected to each other in a manner of being tangential to each other at the connection.

Since the material that makes the pixel separation layer 5 is an inorganic material having less content of moisture and oxygen, it is possible to greatly reduce the amount of moisture and oxygen spread from the pixel separation layer sidewall 51 toward the organic light-emitting layer 3. The pixel separation layer sidewall 51 is composed of a first curved section 511, a linear section 512, and a second curved section 513 that collectively define a contour or shape that allows the organic light-emitting layer 3 set on and covering the pixel separation layer sidewall 51 and the common electrode 4 set on and covering the organic light-emitting layer 3 to be of uniform thicknesses, preventing the organic light-emitting layer 3 and the common electrode 4 from breaking at a site corresponding to the pixel separation layer sidewall 51 and preventing moisture and oxygen from penetrating into the organic light-emitting layer 3 so as to overcome a deterioration issue of the organic light-emitting layer 3 caused by the pixel separation layer sidewall 51, prevent shorting between the common electrode 4 and the pixel electrode 2, and thus improving displaying performance and enhancing the lifespan of the OLED display device.

Specifically, the substrate 1 comprises thin-film transistors, scan lines, and data signal lines formed thereon. The thin-film transistors are each composed of a gate terminal, a semiconductor layer, and source/drain terminals. The pixel electrodes 2 are connected to the source/drain terminals of the thin-film transistors. Specific arrangements and connections of the thin-film transistors, the scan lines, and the data signal lines on the substrate 1 are well known techniques and no detail is necessary here.

The material of the pixel separation layer 5 can be silicon nitride. The pixel separation layer 5 is formed through plasma chemical vapor deposition (CVD). The openings of the pixel separation layer 5 are formed through an etching process. Further, the etching rate of the silicon nitride material is faster if the component ratio of nitrogen thereof is lower. The pixel separation layer 5 can be formed of a plurality of silicon nitride layers having different nitrogen component ratios and stacked on each other in order to provide a desired contour or shape of the pixel separation layer sidewall 51.

The pixel electrode 2 may serve as an anode of the OLED display device, while the common electrode 4 works as a cathode of the OLED display device. In this condition, the pixel electrode 2 can be made of a material of metal oxide that has high work function, such as indium tin oxide (ITO) and indium zinc oxide (IZO); and the common electrode 4 can be made of a material of metal having high electrical conductivity and low work function, such as silver (Ag), magnesium (Mg), aluminum (Al), lithium (Li), gold (Au), nickel (Ni), and calcium (Ca). The pixel electrode 2, which is the anode, may provide an effect of transmission of a light path, while the common electrode 4, which is the cathode, provides an effect of reflection of a light path.

Alternatively, the pixel electrode 2 may serve as a cathode of the OLED display device, while the common electrode 4 is an anode of the OLED display device. In this condition, the pixel electrode 2 is formed of a material of metal having high conductivity and lower work function, such as Ag, Mg, Al, Li, Au, Ni, and Ca; and the common electrode 4 is formed of a material of metal oxide having high work function, such as ITO and IZO. The pixel electrode 2, which is the cathode, provides an effect of reflection of a light path, and the common electrode 4, which is the anode, may provide an effect of transmission of a light path.

The organic light-emitting layer 3 comprises a hole injection layer, a hole transport layer, an emissive layer, an electron transport layer, and an electron injection layer, which are of no difference from those of the known techniques so that no detail is necessary here.

In summary, the present invention provides an OLED display device, in which, on the one hand, an inorganic material is used to form a pixel separation layer in order to greatly reduce the amount of moisture and oxygen spread from a pixel separation layer sidewall to an organic light-emitting layer and, on the other hand, the pixel separation layer sidewall is constructed to comprise a first curved section, a linear section, and a second curved section arranged from top to bottom, wherein the linear section is parallel to a substrate; at least one of a tangential plane of a portion of the first curved section or a tangential plane of a portion the second curved section forms an included angle of less than 85° with respect to the substrate so that an organic light-emitting layer set on and covering the pixel separation layer sidewall and a common electrode set on and covering the organic light-emitting layer may have uniform thicknesses, preventing the organic light-emitting layer and the common electrode from breaking at a site corresponding to the pixel separation layer sidewall and preventing moisture and oxygen from penetrating into the organic light-emitting layer so as to overcome a deterioration issue of the organic light-emitting layer caused by the pixel separation layer sidewall, prevent shorting between the common electrode and the pixel electrode, which are respectively the cathode and anode of the OLED display device, and thus improving displaying performance and enhancing the lifespan of the OLED display device.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic light-emitting display (OLED) device, comprising:
    a substrate;
    a plurality of pixel zones arranged in an array on the substrate, each of the pixel zones comprising a pixel electrode, an organic light-emitting layer, and a common electrode, which are sequentially stacked on the substrate; and
    a pixel separation layer that comprises a plurality of openings, the pixel separation layer separating each of the pixel zones from the other pixel zones, the openings being each delimited and circumferentially surrounded by a pixel separation layer sidewall, each of the openings corresponding to one of the pixel zones;
    wherein the pixel electrode and the organic light-emitting layer are disposed in each of the openings in such a way that the organic light-emitting layer covers the pixel separation layer sidewall, the common electrode covering the organic light-emitting layer and an upper surface of the pixel separation layer; and
    the pixel separation layer is formed of an inorganic material and the pixel separation layer sidewall comprises, arranged from top to bottom, a first curved section, a linear section connected to the first curved section, and a second curved section connected to the linear section, the linear section being parallel to the substrate, at least one of a tangential plane of a portion of the first curved section or a tangential plane of a portion the second curved section forming an included angle of less than 85° with respect to the substrate; and
    wherein the first curved section and the second curved section are both inward concave with respect to the pixel separation layer.

2. The OLED display device as claimed in claim 1, wherein the pixel separation layer is formed of silicon nitride.

3. The OLED display device as claimed in claim 2, wherein the pixel separation layer comprises a plurality of silicon nitride layers having different component ratios of nitrogen and stacked on each other.

4. The OLED display device as claimed in claim 3, wherein the pixel separation layer is formed through plasma chemical vapor deposition (CVD) and the openings of the pixel separation layer are formed through an etching process.

5. The OLED display device as claimed in claim 1, wherein the pixel electrode serves as an anode of the OLED display device and the common electrode serves as a cathode of the OLED display device.

6. The OLED display device as claimed in claim 5, wherein the pixel electrode comprises a material of metal oxide that has high work function and the common electrode comprises a material of metal that has high electrical conductivity and low work function.

7. The OLED display device as claimed in claim 1, wherein the pixel electrode serves as a cathode of the OLED display device and the common electrode serves as an anode of the OLED display device.

8. The OLED display device as claimed in claim 7, wherein the pixel electrode comprises a material of metal that has high electrical conductivity and low work function and the common electrode comprises a material of metal oxide that has high work function.

9. An organic light-emitting display (OLED) device, comprising:
    a substrate;
    a plurality of pixel zones arranged in an array on the substrate, each of the pixel zones comprising a pixel electrode, an organic light-emitting layer, and a common electrode, which are sequentially stacked on the substrate; and
    a pixel separation layer that comprises a plurality of openings, the pixel separation layer separating each of the pixel zones from the other pixel zones, the openings being each delimited and circumferentially surrounded by a pixel separation layer sidewall, each of the openings corresponding to one of the pixel zones;
    wherein the pixel electrode and the organic light-emitting layer are disposed in each of the openings in such a way that the organic light-emitting layer covers the pixel separation layer sidewall, the common electrode covering the organic light-emitting layer and an upper surface of the pixel separation layer; and
    the pixel separation layer is formed of an inorganic material and the pixel separation layer sidewall comprises, arranged from top to bottom, a first curved section, a linear section connected to the first curved section, and a second curved section connected to the linear section, the linear section being parallel to the substrate, at least one of a tangential plane of a portion of the first curved section or a tangential plane of a portion the second curved section forming an included angle of less than 85° with respect to the substrate;
    wherein the first curved section and the second curved section are both inward concave with respect to the pixel separation layer;
    wherein the pixel separation layer is formed of silicon nitride; and
    wherein the pixel separation layer comprises a plurality of silicon nitride layers having different component ratios of nitrogen and stacked on each other.

10. The OLED display device as claimed in claim 9, wherein the pixel separation layer is formed through plasma chemical vapor deposition (CVD) and the openings of the pixel separation layer are formed through an etching process.

11. The OLED display device as claimed in claim 9, wherein the pixel electrode serves as an anode of the OLED display device and the common electrode serves as a cathode of the OLED display device.

12. The OLED display device as claimed in claim 11, wherein the pixel electrode comprises a material of metal oxide that has high work function and the common electrode comprises a material of metal that has high electrical conductivity and low work function.

13. The OLED display device as claimed in claim 9, wherein the pixel electrode serves as a cathode of the OLED display device and the common electrode serves as an anode of the OLED display device.

14. The OLED display device as claimed in claim 13, wherein the pixel electrode comprises a material of metal that has high electrical conductivity and low work function and the common electrode comprises a material of metal oxide that has high work function.

* * * * *